(12) United States Patent
Jung

(10) Patent No.: US 7,705,817 B2
(45) Date of Patent: Apr. 27, 2010

(54) ORGANIC LIGHT EMITTING DIODE DISPLAY DEVICE AND FABRICATING METHOD THEREOF

(75) Inventor: Kwan-Wook Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1033 days.

(21) Appl. No.: 11/111,614

(22) Filed: Apr. 20, 2005

(65) Prior Publication Data
US 2005/0242745 A1    Nov. 3, 2005

(30) Foreign Application Priority Data
Apr. 30, 2004    (KR) .................. 10-2004-0030427

(51) Int. Cl.
*G09G 3/36* (2006.01)
(52) U.S. Cl. .......................... 345/92; 345/76
(58) Field of Classification Search .................. 345/92, 345/76
See application file for complete search history.

(56) References Cited

U.S. PATENT DOCUMENTS

| | | | | |
|---|---|---|---|---|
| 5,266,825 | A * | 11/1993 | Tsukada et al. | 257/366 |
| 5,304,831 | A * | 4/1994 | Yilmaz et al. | 257/341 |
| 5,852,481 | A * | 12/1998 | Hwang | 349/43 |
| 6,476,788 | B1 * | 11/2002 | Akimoto | 345/92 |
| 6,734,505 | B2 * | 5/2004 | Suzuki et al. | 257/365 |
| 6,784,501 | B2 * | 8/2004 | Lane et al. | 257/382 |
| 6,815,754 | B2 * | 11/2004 | Clampitt | 257/308 |
| 7,248,309 | B2 * | 7/2007 | Kim et al. | 349/69 |
| 2002/0167472 | A1 * | 11/2002 | Jinno | 345/76 |
| 2003/0201496 | A1 | 10/2003 | Ymazaki et al. | |
| 2004/0198002 | A1 * | 10/2004 | Murakami et al. | 438/279 |
| 2004/0222472 | A1 * | 11/2004 | Suzuki et al. | 257/365 |

FOREIGN PATENT DOCUMENTS

| | | |
|---|---|---|
| JP | 6-120504 | 4/1994 |
| JP | 2000-340358 | 12/2000 |
| JP | 2002-94069 | 3/2002 |
| JP | 2003-223120 | 8/2003 |
| JP | 2003-273366 | 9/2003 |
| JP | 2003-308030 | 10/2003 |
| KR | 2002-0090574 | 12/2002 |

(Continued)

OTHER PUBLICATIONS

Patent Abstracts of Japan, Publication No. 06-120504, Apr. 28, 1994, 1 p.

(Continued)

*Primary Examiner*—Bipin Shalwala
*Assistant Examiner*—Afroza Y Chowdhury
(74) *Attorney, Agent, or Firm*—Innovation Counsel LLP

(57) ABSTRACT

An organic light emitting diode (OLED) display device and a manufacturing method thereof to improve a luminous character are provided. The OLED display device includes a first transistor, a second transistor and an OLED. An image is displayed by applying a driving current to OLED through the first transistor and the second transistor. The thickness of the gate insulating layers of the first and the second transistor are different. The OLED is provided with the sufficient driving current to improve the luminous character without decreasing emissive area.

23 Claims, 14 Drawing Sheets

FOREIGN PATENT DOCUMENTS

| | | |
|---|---|---|
| KR | 2003-0024095 | 3/2003 |
| KR | 2003-0065331 | 8/2003 |
| KR | 2003-0079689 | 10/2003 |
| KR | 2003-0086168 | 11/2003 |

OTHER PUBLICATIONS

Patent Abstracts of Japan, Publication No. 2000-340358, Dec. 8, 2000, 1 p.
Patent Abstracts of Japan, Publication No. 2002-094069, Mar. 29, 2002, 1 p.
Patent Abstracts of Japan, Publication No. 2003-223120, Aug. 8, 2003, 1 p.
Patent Abstracts of Japan, Publication No. 2003-273366, Sep. 26, 2003, 1 p.
Patent Abstracts of Japan, Publication No. 2003-308030, Oct. 31, 2003, 2 pp.
Korean Patent Abstracts, Publication No. 1020020090574, Dec. 5, 2002, 1 p.
Korean Patent Abstracts, Publication No. 1020030024095, Mar. 26, 2003, 1 p.
Korean Patent Abstracts, Publication No. 1020030065331, Aug. 6, 2003, 1 p.
Korean Patent Abstracts, Publication No. 1020030079689, Oct. 10, 2003, 1 p.
Korean Patent Abstracts, Publication No. 1020030086168, Nov. 7, 2003, 1 p.

* cited by examiner

ORGANIC LIGHT EMITTING DIODE DISPLAY DEVICE AND FABRICATING METHOD THEREOF

CROSS-REFERENCE TO RELATED APPLICATION

This application claims priority based upon Korean Patent Application No. 2004-0030427 filed on Apr. 30, 2004.

BACKGROUND

1. Field of the Invention

The present invention relates to a transistor for an organic light emitting diode (OLED) display device and a method of fabricating the same.

2. Description of Related Art

Conventional OLED includes an organic light emitting layer disposed between two electrodes. When an electron and a hole are respectively injected into the organic light emitting layer from the two electrodes, the electron and the hole couples to form an exciton. The organic light emitting layer generates light when the energy level of the exciton changes from an excitation state to a ground state. The OLED display device can be categorized as an active matrix type and a passive matrix type. The active matrix type OLED display device drives each OLED pixel using a transistor formed in the pixel.

The transistor of the conventional OLED display device is often fabricated based on a polysilicon structure which produces superior electrical properties to amorphous silicon structure. However, the transistor formed of polysilicon has several drawbacks. For example, the transistor may have a complicated structure, which causes low yield of the transistor fabrication and extended manufacturing time.

Accordingly, an OLED display device using amorphous silicon has been proposed. In order to be employed in the OLED display device, the amorphous silicon transistor should improve its electrical performance. For instance, the poor electron mobility of amorphous silicon limits the increase of luminescence of OLED display. The size increase of the transistor controlling the current flowing to OLED pixel may solve this problem, but decreases the size of display area. Thus, there is a need for increasing the luminescence without reducing the display area.

SUMMARY OF THE INVENTION

An OLED display device according to an embodiment of the invention includes: a first transistor that has a first gate insulating layer, a second transistor that is electrically connected to first transistor and has a second gate insulating layer, a light emitting diode driven by second transistor. First gate insulating layer is thicker than second gate insulating layer. Light emitting diode includes a pixel electrode electrically connected to second transistor, an organic light emitting layer disposed over pixel electrode and a counter electrode disposed over organic light emitting layer.

An OLED display device according to another embodiment of the invention includes: a first transistor that receives a data signal from a data bus line and outputs a control signal depending on the magnitude of the data signal, a second transistor that receives the control signal from first transistor and produces a driving current in response to the control signal, a light emitting diode that receives the driving current and emits a light. First transistor includes a first gate insulating layer. Second transistor includes a second gate insulating layer. The thickness of first gate insulating layer is different form the thickness of second gate electrode.

A method of forming an OLED display device according to another embodiment of the invention includes: forming a first gate electrode and a second gate electrode over a substrate, forming a first insulating layer over the substrate, removing partially the first insulating layer in an area on and around second gate electrode, forming a second insulating layer over the first insulating layer and the second gate electrode, forming a first semiconductor pattern over the second insulating layer on the first gate electrode and a second semiconductor pattern over the second insulating layer on the second gate electrode, forming a first source electrode and a first drain electrode on the first semiconductor pattern, forming a second source electrode and a second drain electrode on the second semiconductor pattern, and forming an organic light emitting diode connected to the second drain electrode. Light emitting diode includes a pixel electrode, a light emitting layer and a counter electrode.

OLED display device according to the present invention is provided with the sufficient driving current to improve the luminous character without decreasing emissive area.

BRIEF DESCRIPTION OF THE DRAWINGS

The features of the present invention will become more apparent to those of ordinary skill in the art by describing in detail exemplary embodiments thereof with reference to the attached drawings, in which.

Use of the same reference symbols in different figures indicates similar of identical items.

DETAILED DESCRIPTION OF PREFERRED EMBODIMENTS

Figure 1:
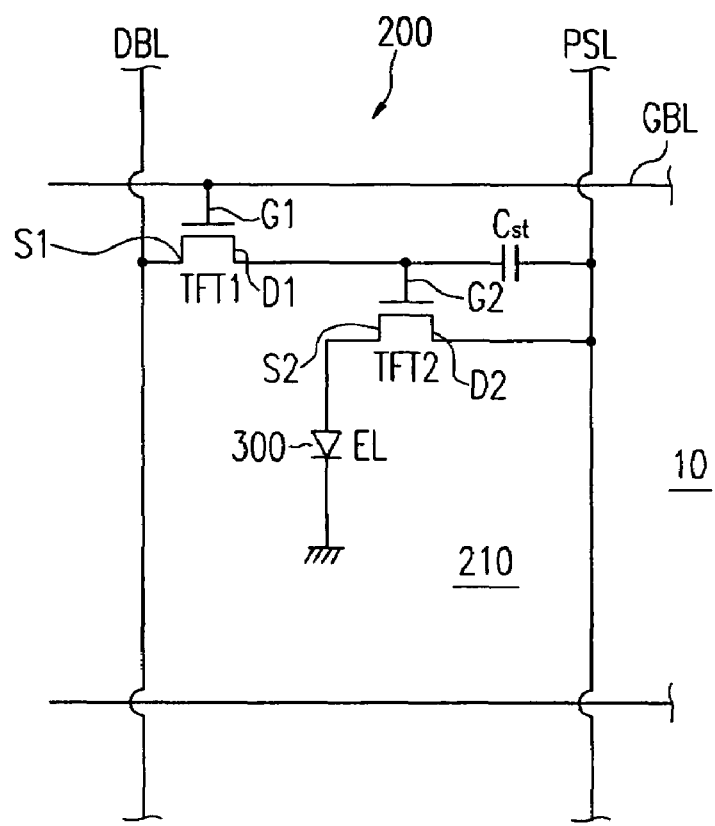
FIG. 1 is a circuit diagram of a pixel of an organic light emitting diode (OLED) display device according to an embodiment of the present invention.

FIG. 1 is a circuit diagram of a pixel 210 of an OLED display device 200 according to an embodiment of the present invention. Pixel 210 includes a gate bus line GBL, a data bus lines DBL, and a power supply lines PSL. In OLED display device 200, multiple pixels 210 are connected to one another in a matrix type. Gate bus line GBL transmits a gate signal (or a control signal). Gate bus line GBL extends in a horizontal direction and is arranged in parallel to another gate bus line GBL. Data bus line DBL transmits a data signal. Data bus line DBL extends in a vertical direction and is arranged in parallel to another data bus line DBL. Power supply line PSL is formed adjacent to the data bus line (not shown) of an adjacent pixel. The power supply line PSL extends in a vertical direction, and transmits a direct current signal Vdd.

Pixel 210 further includes a switching transistor TFT1 connected to gate bus line GBL and data bus line DBL, a driving transistor TFT2 connected to power supply line PSL and switching transistor TFT1, a storage capacitor Cst, and a light emitting diode 300 connected to driving transistor TFT2.

Switching transistor TFT1 includes a first gate electrode G1 connected to gate bus line GBL, a first source electrode S1 connected to data bus line DBL, and a first drain electrode D1. Driving transistor TFT2 includes a second gate electrode G2, a second source electrode S2 connected to light emitting diode 300, and a second drain electrode D2 connected to power supply line PSL.

Storage capacitor Cst is connected to first drain electrode D1, second gate electrode G2 and power supply line PSL. Storage capacitor Cst stores and maintains a voltage between first drain electrode D1 and power supply line PSL. Although not shown in FIG. 1, storage capacitor Cst can be formed between first drain electrode D1 and light emitting diode 300.

Figure 2:
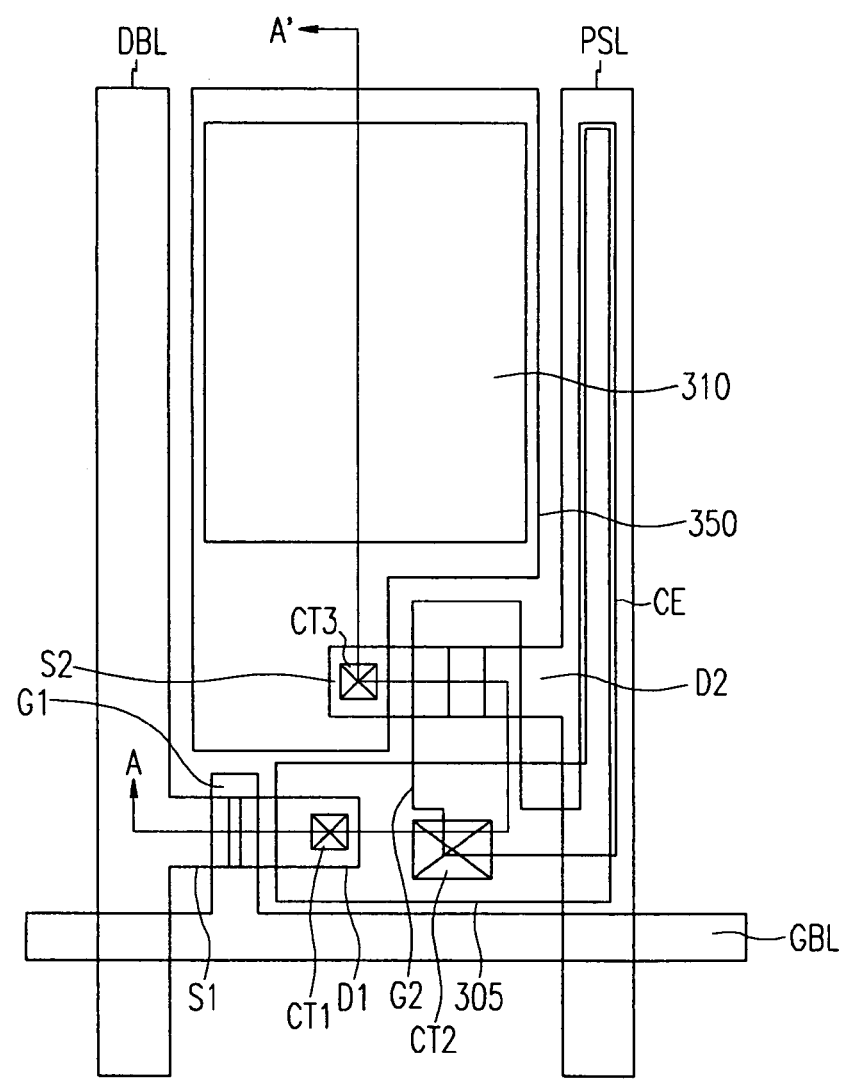
FIG. 2 is a plan view of the OLED display device of FIG. 1.
Figure 3:
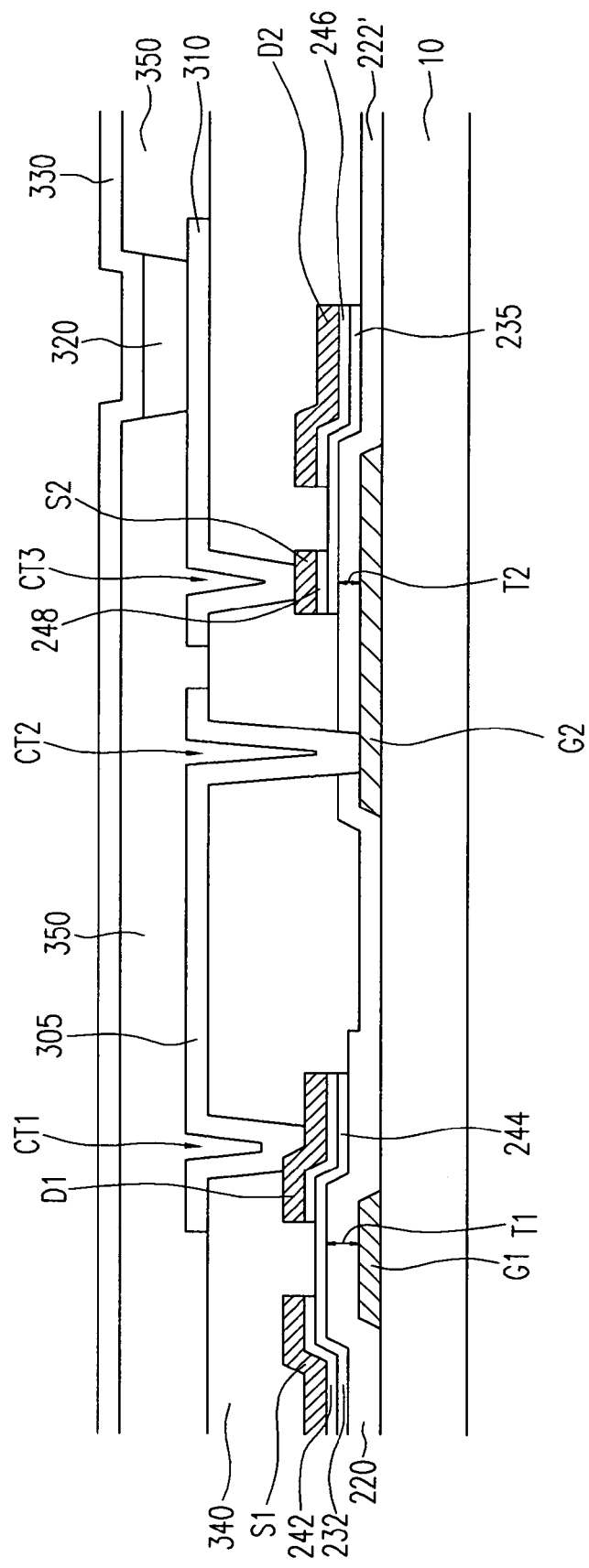
FIG. 3 is a cross-sectional view taken along the line A-A' of the OLED display device of FIG. 2.

FIG. 2 is a plan-view of OLED display device 200 of FIG. 1, and FIG. 3 is a cross-sectional view taken along the line A-A' of FIG. 2. Referring to FIG. 2 and FIG. 3, the structure of OLED display device 200 is explained.

Gate bus line GBL, first gate electrode G1 and second gate electrodes G2 are formed on a substrate 10. Gate bus line GBL extends in a horizontal direction. First gate electrode G1 protrudes from gate bus line GBL. The gate bus line GBL extends to connect to a driving circuit (not shown) formed on substrate 10 or a driving circuit chip (not shown) attached to a flexible printed film (not shown). Gate bus line GBL may have a pad at end portion of gate bus line GBL to transmit a gate signal from an external circuit to gate bus line GBL.

Second gate electrode G2 is spaced apart from gate bus line GBL and extends to a storage electrode CE. Gate bus line GBL and second gate electrode G2 are formed of a conductive material, such as aluminum, copper, titanium, tantalum, molybdenum, or alloys thereof. Gate bus line GBL can have a multiple-layered structure as well as a single-layered structure. When gate bus line GBL has a multiple-layered structure, one layer is made of a material having a low resistance, such as aluminum, aluminum alloy, silver, silver alloy, copper, or copper alloy in order to reduce a signal delay and a voltage drop. Another layer is made of a material having a good contact capability, such as chromium, molybdenum, titanium, tantalum, or alloys thereof. The side walls of gate bus line GBL and second gate electrode G2 are sloped at 30° to 80° against the surface of substrate 10.

A first gate insulating layer 220 and a second gate insulating layer 222' are respectively formed on gate bus line GBL and second gate electrode G2. First and second gate insulating layers 220, 222' can be formed of an insulating material, such as SiNx and SiOx, and a high dielectric material such as $HfO_2$ and $Al_2O_3$.

A first semiconductor pattern 232 and a second semiconductor pattern 235 are disposed respectively over first gate insulating layer 220 and second gate insulating layer 222'. First and second semiconductor patterns 232, 235 are formed of hydrogenated amorphous silicon or poly-silicon.

A first ohmic contact layer 242 and a second ohmic contact layer 244 are disposed on first semiconductor pattern 232 and spaced apart from each other with a predetermined distance. First ohmic contact layer 242 reduces the contact resistance between first semiconductor pattern 232 and first source electrode S1, and second ohmic contact layer 244 reduces the contact resistance between first semiconductor pattern 232 and first drain electrode D1. A third ohmic contact layer 246 and a fourth ohmic contact layer 248 are disposed on the second semiconductor pattern 235 and spaced apart from each other with a predetermined distance. Third ohmic contact layer 246 reduces the contact resistance between second semiconductor pattern 235 and second drain electrode D2, and fourth ohmic contact layer 246 reduces the contact resistance between second semiconductor pattern 235 and second source electrode S2. Ohmic contact layers 242, 244, 246, 248 are formed of silicide or n+amorphous silicon layer into which a dopant injected.

Data bus line DBL extended from first source electrode S1, first drain electrode D1, second source electrode S2 and power supply line PSL extended from second drain electrode D2 are disposed on ohmic contact layers 242, 244, 246, 248. In accordance with an another embodiment of the invention, data bus line DBL and power supply line PSL are respectively disposed on first gate insulating layer 220 and second gate insulating layer 222'.

Data bus line DBL transmitting a data signal extends in a vertical direction and is perpendicular to gate bus line GBL. Data bus line DBL can have a pad at its end to transmit the data signal from external circuit to date bus line DBL. First source electrode S1 connected to data bus line DBL and disposed on first ohmic contact layer 242 is spaced apart form first drain electrode D1 disposed on second ohmic contact layer 244.

Power supply line PSL is formed adjacent to the data bus line (not shown) of an adjacent pixel and extends in parallel to data bus line DBL. Second drain electrode D2 connected to power supply line PSL is disposed on the third ohmic contact layer 246. Second drain electrode D2 is spaced apart from second source electrode S2 disposed on fourth ohmic contact layer 248. Power supply line PSL overlaps with storage electrode CE to form storage capacitor Cst.

Switching transistor TFT1 includes first semiconductor pattern 232, first ohmic contact layer 242, second ohmic contact layer 244, first gate electrode G1, first source electrode S1, and first drain electrode D1. The space between first source electrode S1 and first drain electrode D1 forms a channel of switching transistor TFT1 on first semiconductor pattern 232. Switching transistor TFT transfers the data signal from data bus line DBL to second gate electrode G2 of driving transistor TFT2. As shown in FIG. 3, first semiconductor pattern 232 is insulated from first gate electrode G1 by the first gate insulating layer 220. First gate insulating layer 220 has a thickness T1.

Driving transistor TFT2 includes second semiconductor pattern 235, third ohmic contact layer 246, fourth ohmic contact layer 248, second gate electrode G2, second source electrode S2 and second drain electrode D2. Driving transistor TFT2 provides and controls the amount of the current flowing through light emitting diode 300. The space between second source electrode S2 and second drain electrode D2 forms a channel of driving transistor TFT2 on second semiconductor pattern 235. Second gate insulating layer 222' insulates second semiconductor pattern 235 from second gate electrode G2. Second gate insulating layer 222' has a thickness T2, which is smaller than thickness T1.

Generally, the amount of current flowing in a transistor is given by equation 1.

$$Id = Cg\mu W(Vgs-Vth)^{2/L} \quad (1),$$

where Cg is the capacitance of gate insulating layer, μ is the charge mobility, W is the channel width of the transistor, Vgs is the voltage applied between the transistor and the transistor source, Vth is the threshold voltage of the transistor, and L is the channel length of the transistor.

Also, the capacitance Cg of gate insulating layer is given by equation 2.

$$Cg = \in A/d \quad (2),$$

where ∈ is the dielectric constant of the gate insulating layer, A is the area of gate insulating layer overlapped with the gate electrode, and d is the thickness of the gate insulating layer.

Referring to equations 1 and 2, the amount of the current (Id) flowing in the transistor is proportional to capacitance Cg of the gate insulating layer and the channel width W of the transistor. Capacitance Cg of the gate insulating layer is inversely proportional to the thickness of the gate insulating layer. Accordingly, the decrease of the thickness of gate insulating layer causes the increase of the amount of current flowing in the transistor without increasing the size of the transistor.

For example, light emitting diode 300 needs 3 μA current to a light of 300 cd. When, in FIG. 3, gate insulating layer thickness T2 of driving transistor TFT2 is 4500 Å, the width W of driving transistor TFT2 for producing the current of 3 μA is 300 μm. When the thickness T2 of gate insulating layer 222' is reduced to 2000 Å, the width W of driving transistor TFT2 for producing the current of 3 μA decreases to 100 μm. The decrease of the width W of driving transistor TFT2 results in the increase of emissive area (or aperture). If the width W of driving transistor TFT2 is fixed to be 300 μm, the driving current of driving transistor TFT2 increases without a reduction of the emissive area.

However, when the thickness T2 of gate insulating layer 222' of driving transistor TFT2 and the thickness T1 of gate insulating layer 220 of switching transistor TFT1 simultaneously decrease to increase the driving current of driving transistor TFT2, a reliability problem such as the breakdown of switching transistor TFT1 may occur.

Generally, the driving voltage applied to first gate electrode G1 of switching transistor TFT1 is 20V to 25V. The driving voltage applied to second gate electrode G2 is less than 10 V. Switching transistor TFT1 is driven by a higher voltage than driving transistor TFT2.

According to the present invention, the thickness T2 of second gate insulating layer 222' of driving transistor TFT2 is smaller than the thickness T1 of first gate insulating layer 220 of switching transistor TFT1. In this case, the driving current and the luminescence of light emitting diode 300 increase without the reliability problem. For example, when the thickness T1 of first gate insulating layer 220 is 3000 to 4500 Å, the thickness T2 of second gate insulating layer 222' is 1500 to 3500 Å. When the thickness T1 of first gate insulating layer 220 is less than 3000 Å, the breakdown of switching transistor TFT1 may occur because switching transistor TFT1 is driven by a high voltage. When the thickness T1 of first gate insulating layer 220 is larger than 4500 Å, the current flowing through switching transistor TFT1 decreases. When the thickness T2 of second gate insulating layer 222' is less than 1500 Å, the reliability problem may occur in driving transistor TFT2. When the thickness T2 of second gate insulating layer 222' is larger than 3500 Å, the current flowing through driving transistor TFT2 decrease. The range of the optimum thickness of first and second gate insulating layer 220, 222' depends on the size of switching transistor TFT1 and driving transistor TFT2.

Data bus line DBL, power supply line PSL, first drain electrode D1 and second source electrode S2 are formed of a refractory metal such as chromium, titanium, tantalum, molybdenum or an alloy thereof. Data bus line DBL, power supply line PSL, first drain electrode D1 and second source electrode S2 can have a multiple-layer structure as well as a single-layer structure. The sidewalls of data bus line DBL, power supply line PSL, first drain electrode D1 and second source electrode S2 are respectively sloped at 30° to 80° against the surface of substrate 10.

A first insulating interlayer 340 is formed over data bus line DBL, power supply line PSL, first drain electrode D1, second source electrode S2 and portions of semiconductor patterns 232, 235. First inter insulating layer 340 can be formed of a photosensitive or non-photosensitive organic material or a low dielectric material with a dielectric constant of 4.0 or lower, such as a-Si:C:O and a-Si:O:F, which can be formed by a plasma enhanced chemical vapor deposition. In addition, first insulating interlayer 340 can be formed of an inorganic material such as SiNx, and can have a multiple-layered structure including an inorganic under-layer and an organic upper-layer.

Through first insulating interlayer 340, a first contact hole CT1 exposing first drain electrode D1, a second contact hole CT2 exposing second gate electrode G2, and a third contact hole CT3 exposing second source electrode S2 are formed. On first insulating interlayer 340, a pixel electrode 310 is formed so as to connect to second source electrode S2 through third contact hole CT3, and a connecting electrode 305 is formed so as to make connection between first drain electrode D1 and second gate electrode G2 through first contact hole CT1 and second contact hole CT2.

Pixel electrode 310 receives the driving current from power supply line PSL. Pixel electrode 310 is formed of a transparent conductive material and within the area defined by gate bus line GBL and data bus line DBL.

A bank 350 is formed on first insulating interlayer 340, pixel electrode 310, and connecting electrode 305. Bank 350 which is made of an insulating material has a through-hole that exposes a portion of pixel electrode 310.

An organic light emitting layer 320 is formed in the hole of bank 350. Organic light emitting layer 320 includes a light emitting layer which emits red, green or blue. Organic light emitting layer 320 may further include at least one of a hole injection layer, a hole transporting layer, an electron transporting layer and an electron injection layer.

A counter electrode 330, which covers the whole area of substrate 10 except where terminals for connecting to external circuits are formed, is formed over bank 350 and organic light emitting layer 320. Counter electrode 330 is formed of at least one of aluminum (Al), calcium (Ca), barium (Ba), magnesium (Mg), and their alloys and provides electrons into organic light-emitting layer 320. In accordance with the embodiment of FIG. 1, when the data signal voltage and the gate signal voltage are respectively applied to data bus line DBL and switching transistor TFT1, switching transistor TFT1 transmits the data signal voltage from data bus line DBL to second gate electrode G2 of driving transistor TFT2 and storage capacitor Cst. Then, depending on the difference between the voltage applied to second gate electrode G2 and the voltage applied to second source electrode S2, driving transistor TFT2 allows the current from power supply line PSL to flow to light emitting diode 300. Storage capacitor Cst stores the voltage difference until a next data signal voltage is transmitted to, so that a uniform current can flow through driving transistor TFT2 until the next data signal voltage arrives.

When the current is provided from driving transistor TFT2 to light emitting diode 300, pixel electrode 310 injects holes to organic light emitting layer 320, and counter electrode 330 injects electrons to organic light emitting layer 320. When the electrons and the holes are injected into, organic light emitting layer 320 generates excitons by coupling the electrons to the holes and generates light when the energy level of the excitons changes from an excitation state to a ground state.

In accordance with other embodiments of the present invention, the arrangement and material for pixel electrode 310 and counter electrode 330 can be varied. In one exemplary case, where the direction of light emission is reversed, pixel electrode 310 is formed of at least one of aluminum (Al), calcium (Ca), barium (Ba), magnesium (Mg), and their alloys and provides electrons into organic light-emitting layer 320, and counter electrode 330 is formed of ITO.

In another exemplary case, where the direction of light emission is also reversed, counter electrode 330 is formed of at least one of aluminum (Al), calcium (Ca), barium (Ba), magnesium (Mg), and their alloys. However, counter electrode 330 is formed to be thin so that counter electrode 330 becomes transparent. Pixel electrode 310 has a double-layer structure. The upper layer is formed of ITO or IZO, and the lower layer is formed of a metal layer so as reflect the light emitted from organic light emitting layer 320. Silver, chromium, and aluminum can be used as the lower layer.

FIGS. 4 to 14 illustrate a method of fabricating an OLED display device of FIG. 2.

Figure 4:
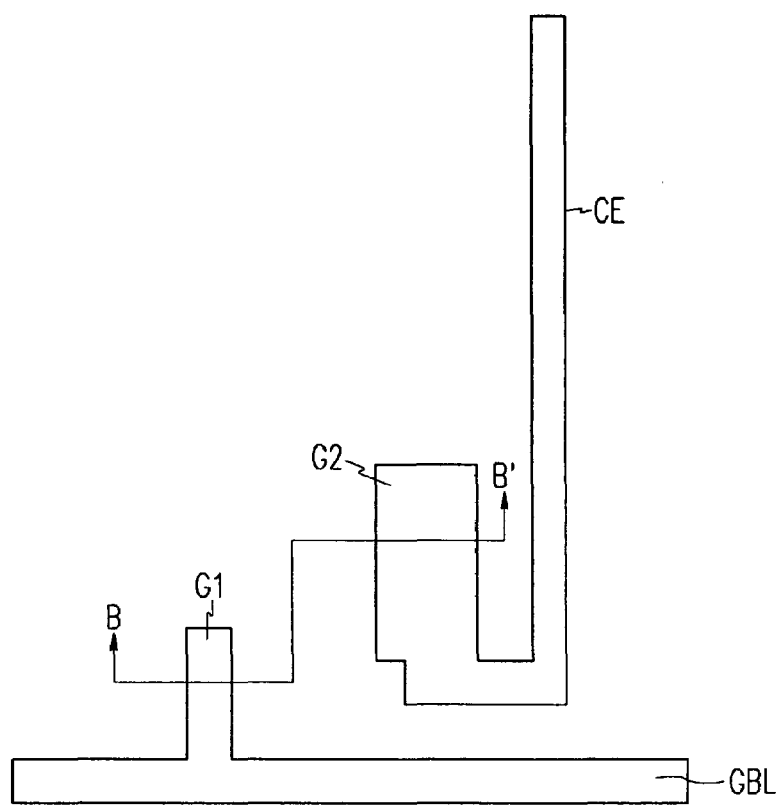
FIG. 4 is a plan view of a first and a second gate electrode of the OLED display device of FIG. 2.
Figure 5:
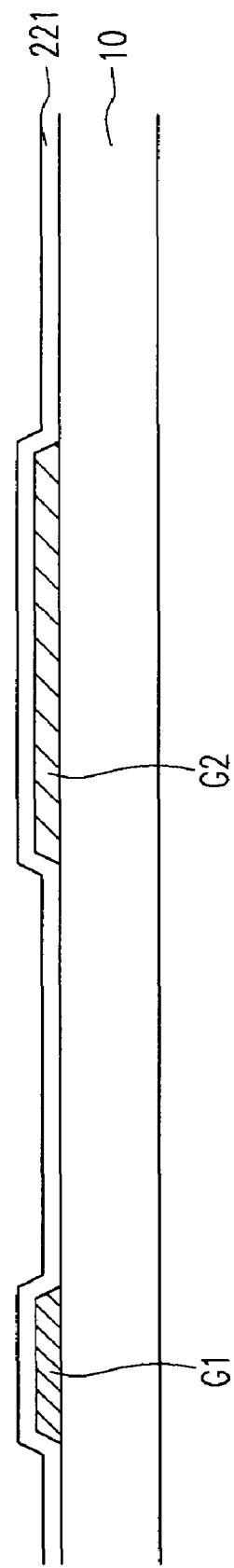
FIG. 5 is a cross-sectional view taken along the line B-B' of FIG. 4.

FIG. 4 is a plan view showing gate bus line GBL including first gate electrode G1, and second gate electrode G2. FIG. 5 is a cross sectional view taken along the line B-B' of FIG. 4.

Referring to FIGS. 4 and 5, a metal layer is formed over substrate 10 by a chemical vapor deposition (CVD) or a sputtering. Gate bus line GBL, first gate electrode G1, second gate electrode G2 and storage electrode CE are formed by patterning the metal layer.

Gate bus line GBL extends in a horizontal direction as shown in FIG. 4. First gate electrode G1 protrudes in a vertical direction from gate bus line GBL. Second gate electrode G2 is spaced apart from first gate electrode G1 by a predetermined distance. Second gate electrode G2 extends so as to include storage electrode CE. Storage electrode CE is arranged in the vertical direction and is spaced apart from gate bus line GBL by a predetermined distance.

A first insulating layer 221 is formed over substrate 10 after forming gate bus line GBL, first gate electrode G1 and second gate electrode G2, and storage electrode CE. First insulating layer can be formed of an insulating material such as $SiN_x$ or $SiO_x$, or a high dielectric material such as $HfO_2$.

Figure 6:
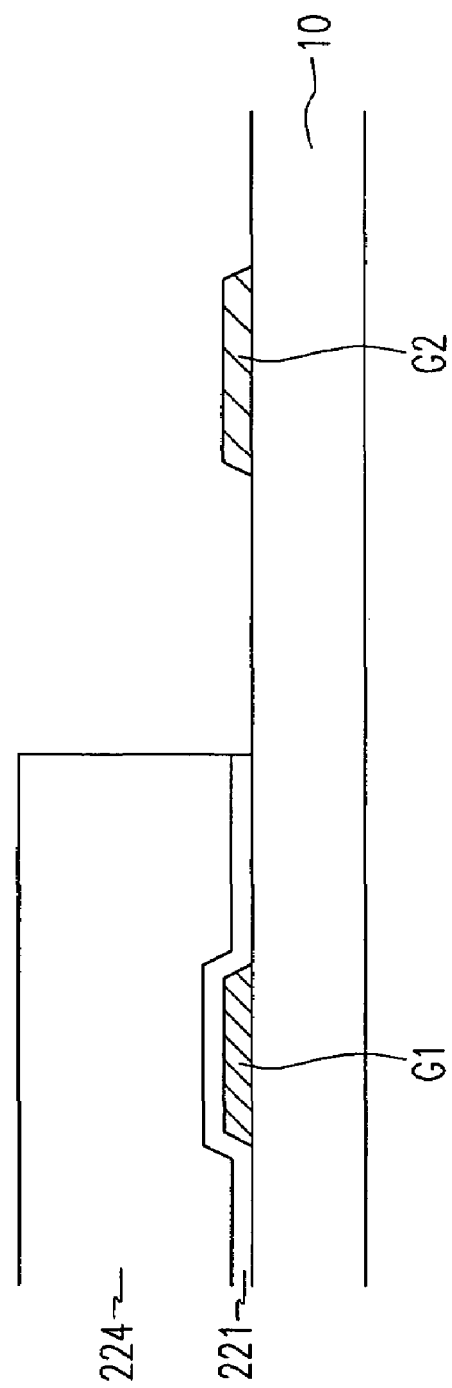
FIG. 6, FIG. 7 and FIG. 8 are cross sectional views showing a method of fabricating a gate-insulating layer according to an embodiment of the present invention.
Figure 7:
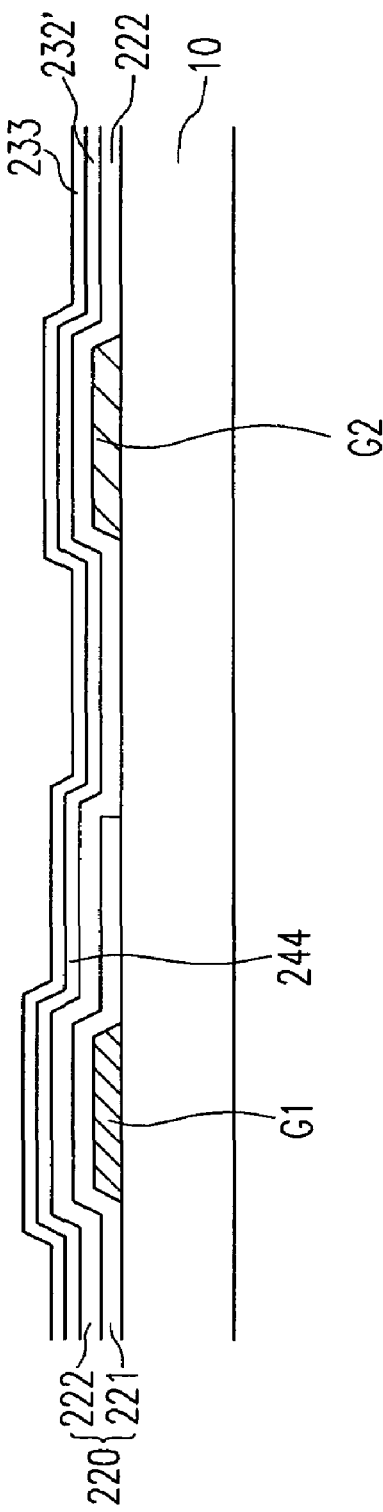
Figure 8:
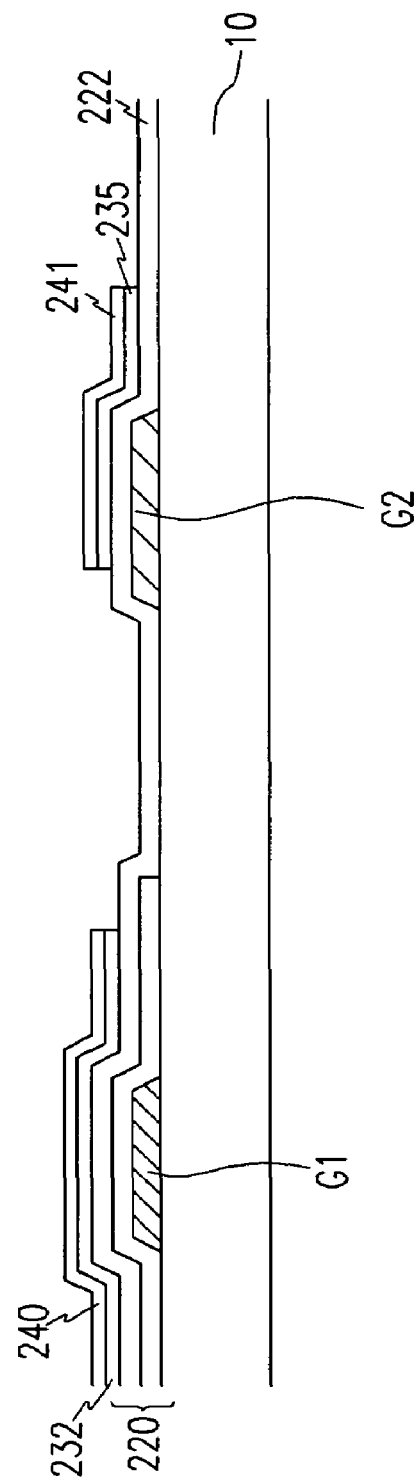

FIGS. 6 to 8 illustrates a method of fabricating gate insulating layer thickness T1 (FIG. 3) larger than gate insulating layer thickness T2 (FIG. 3).

Referring to FIG. 6, wet or dry etching patterns first insulating layer 221 using a blocking layer 224, so that the remaining portion of first insulating layer 221 covers first gate electrode G1. Blocking layer 224 is a photo-resist layer. When $SiN_x$ is used as insulating layer 221, phosphoric acid and $SF_6$ gas are used as an etching agent for wet and dry etching, respectively. Referring to FIG. 7, after blocking layer 224 is removed, second insulating layer 222 is formed so as to cover gate bus line GBL, first gate electrode G1, second gate electrode G2 and storage electrode CE. As the result, first insulating layer 221 and second insulating layer 222 forms first gate insulating layer 220 on first gate electrode G1. Second insulating layer 222 forms second gate insulating layer 222' on second gate electrode G2. Accordingly, first gate insulating layer 220 on first gate electrode G1 is thicker than second gate insulating layer 222' on the second gate electrode G2. After the formation of second insulating layer 222, an amorphous silicon layer 232' and a doped amorphous silicon layer 233 are sequentially formed on second insulating layer 222 by a chemical vapor deposition (CVD).

Referring to FIG. 8, by patterning amorphous silicon layer 232' and doped amorphous silicon layer 233, first semiconductor pattern 232, second semiconductor pattern 235, a first doped semiconductor pattern 240 and a second doped semiconductor pattern 241 are formed.

Figure 9:
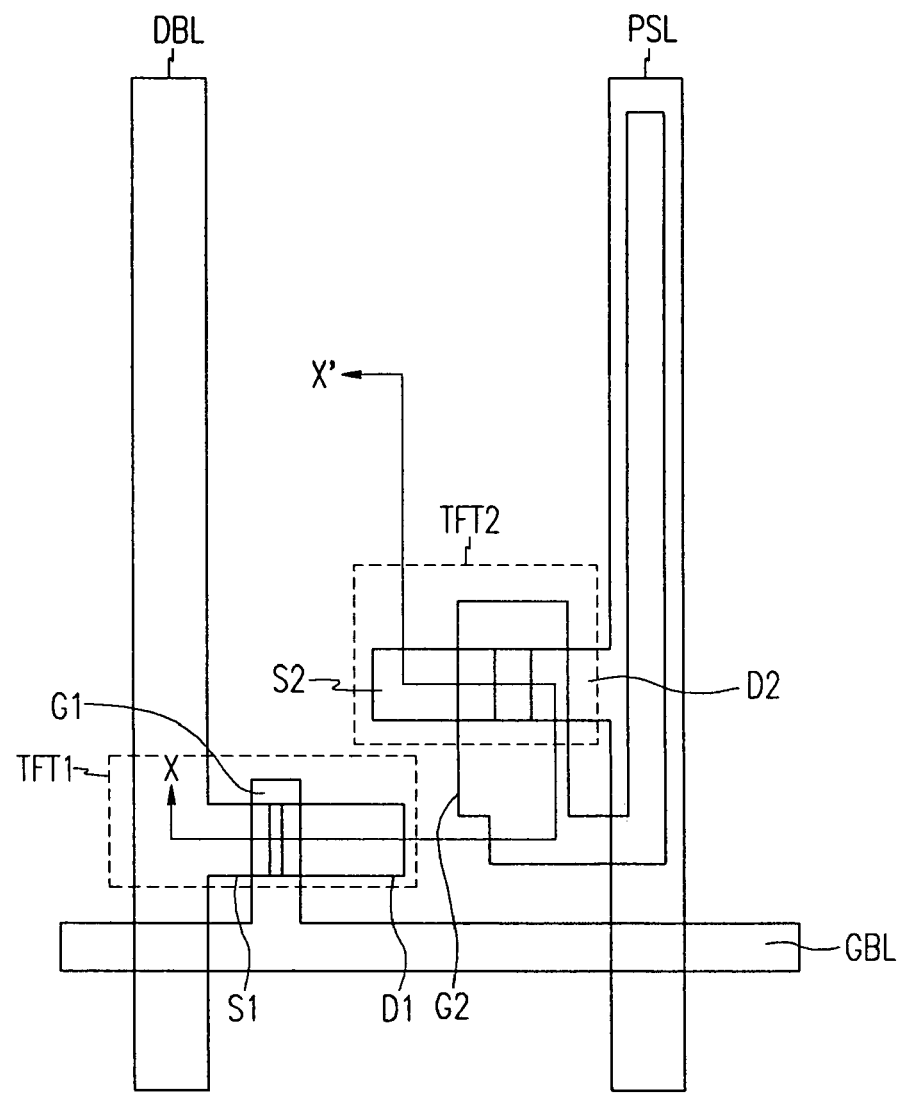
FIG. 9 is a plan-view of a first and a second drain electrode formed on the first and the second source electrode of FIG. 2.
Figure 10:
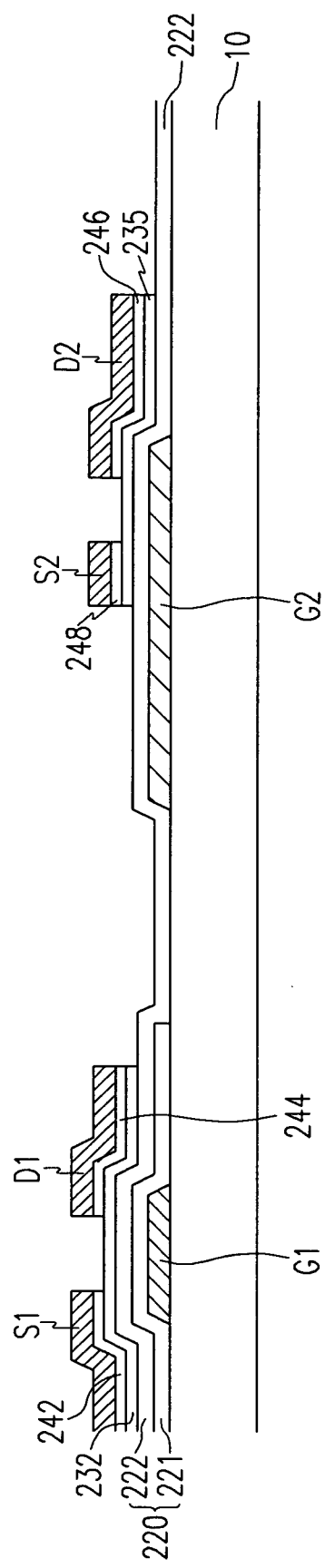
FIG. 10 is a cross-sectional view taken along the line C-C' of FIG. 9.

FIG. 9 is a plan view of a data bus line, a first and a second source electrode, a power supply line, a first and second drain electrode of FIG. 2, and FIG. 10 is a cross sectional view taken along the line C-C' of FIG. 9.

Referring to FIGS. 9 and 10, a metal layer is formed on doped semiconductor patterns 240, 241 (FIG. 8) by a chemical vapor deposition or a sputtering. The metal layer is patterned so as to form data bus line DBL, first source electrode S1, first drain electrode D1, power supply line PSL, second drain electrode D2 and second source electrode S2 and to expose the portions of doped semiconductor patterns 240, 241, under which first gate electrode G1 and second gate electrode G2 are. Then the exposed portions of doped semiconductor patterns 240, 241 are removed so as to expose the portions of first semiconductor pattern 232 and second semiconductor pattern 235. As a result, first ohmic contact layer 242 is formed under the first source electrode S1, and second ohmic contact layer 244 is formed under first drain electrode D1, third ohmic contact layer 246 is formed under second drain electrode D2, and fourth ohmic contact layer 248 is formed under second source electrode S2. First ohmic contact layer 242 and second ohmic contact layer 244 are spaced apart each other by a predetermined distance, and third ohmic contact layer 246 and fourth ohmic contact layer 248 are spaced apart each other by a predetermined distance. The surfaces of first and second semiconductor patterns 232, 235 are treated by plasma to stabilize the surface.

Figure 11:
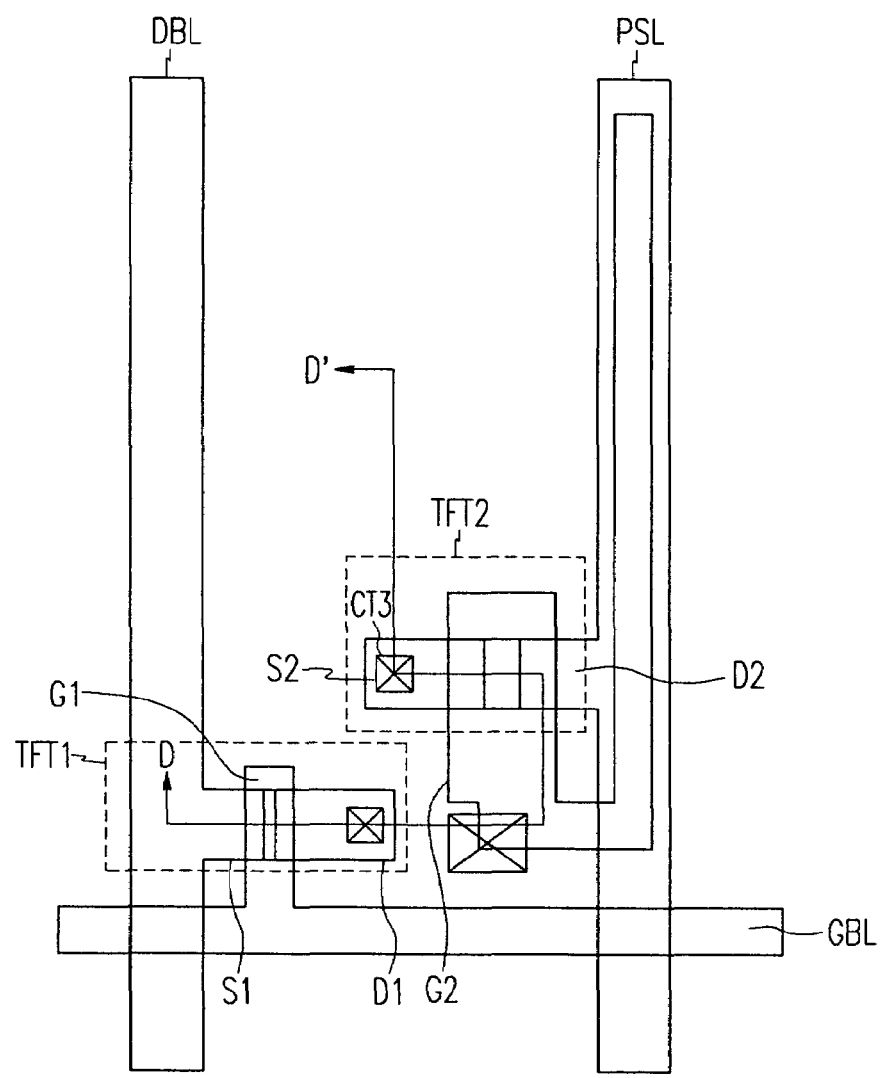
FIG. 11 is a plan view showing contact holes formed at the first and the second drain electrode of FIG. 9.
Figure 12:
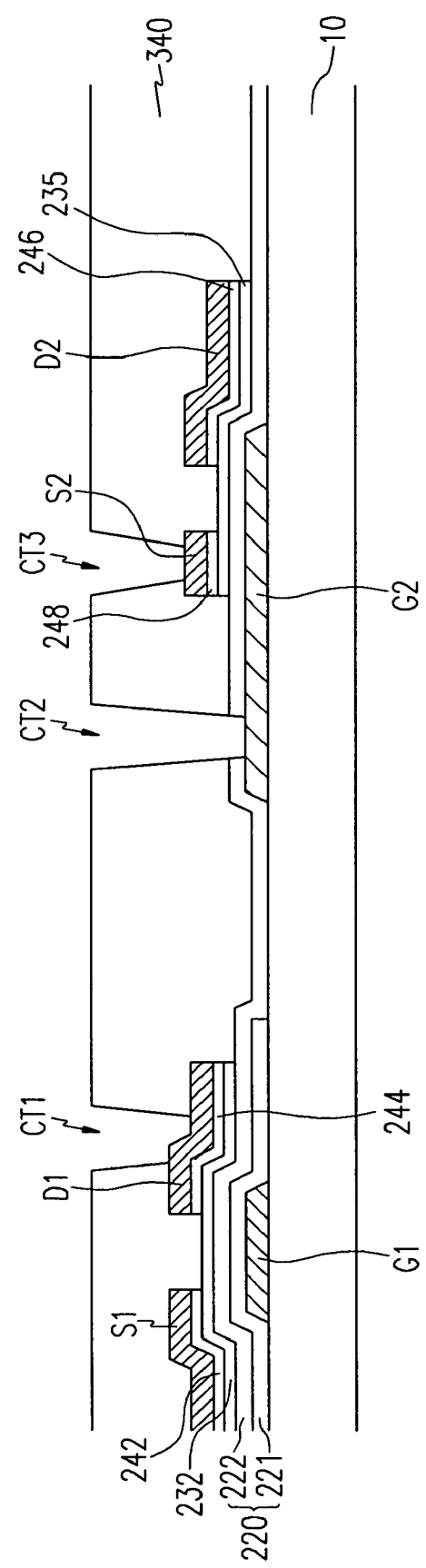
FIG. 12 is a cross-sectional view taken along the line D-D' of FIG. 11.

FIG. 11 is a plan view showing contact holes formed at the first and the second drain electrode of FIG. 9. FIG. 12 is a cross sectional view taken along the line D-D' of FIG. 11.

Referring to FIGS. 11 and 12, on the structure of FIG. 10, first insulating interlayer 340 is formed by a chemical vapor deposition (CVD). Then first insulating interlayer 340 is patterned to form first contact hole CT1 exposing a portion of first drain electrode D1, second contact hole CT2 exposing a portion of second gate electrode G2 and third contact hole CT3 exposing a portion of the second source electrode S2. Insulating interlayer 340 is formed of SiNx.

Figure 13:
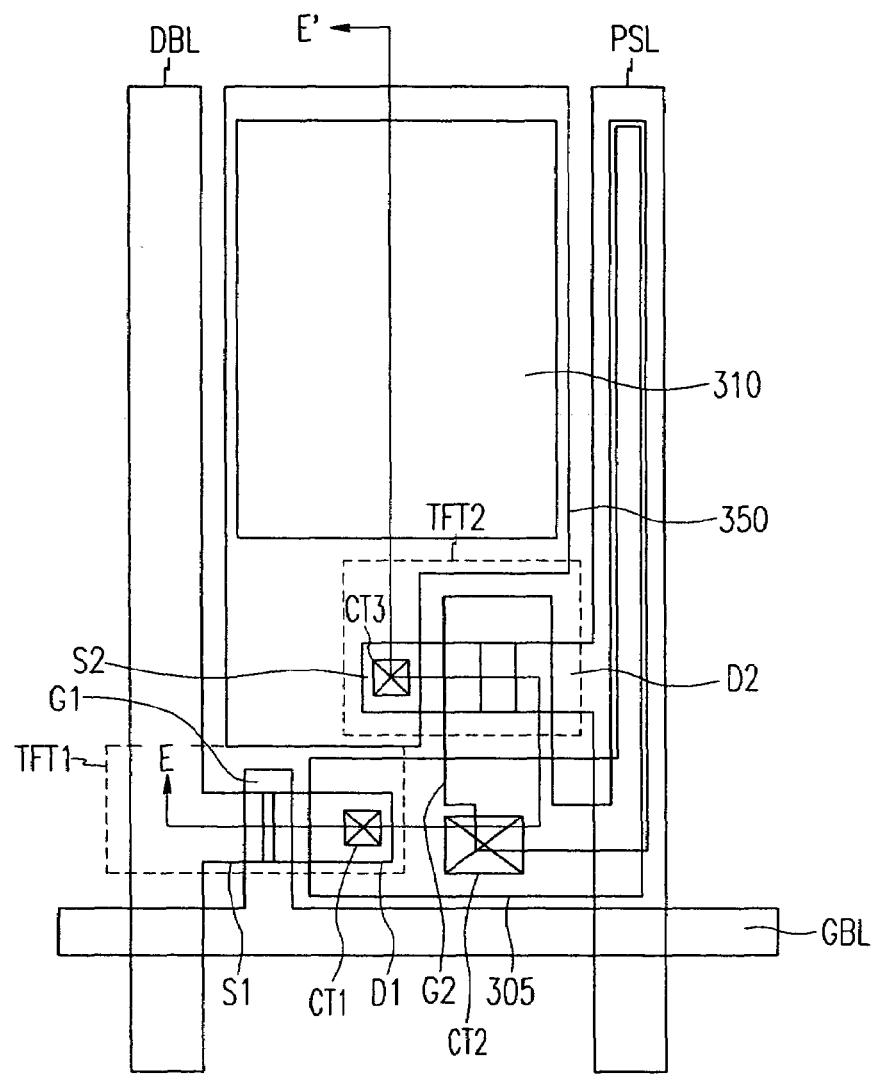
FIG. 13 is a plan view showing a connecting electrode and a pixel electrode formed on the structure of FIG. 11.
Figure 14:
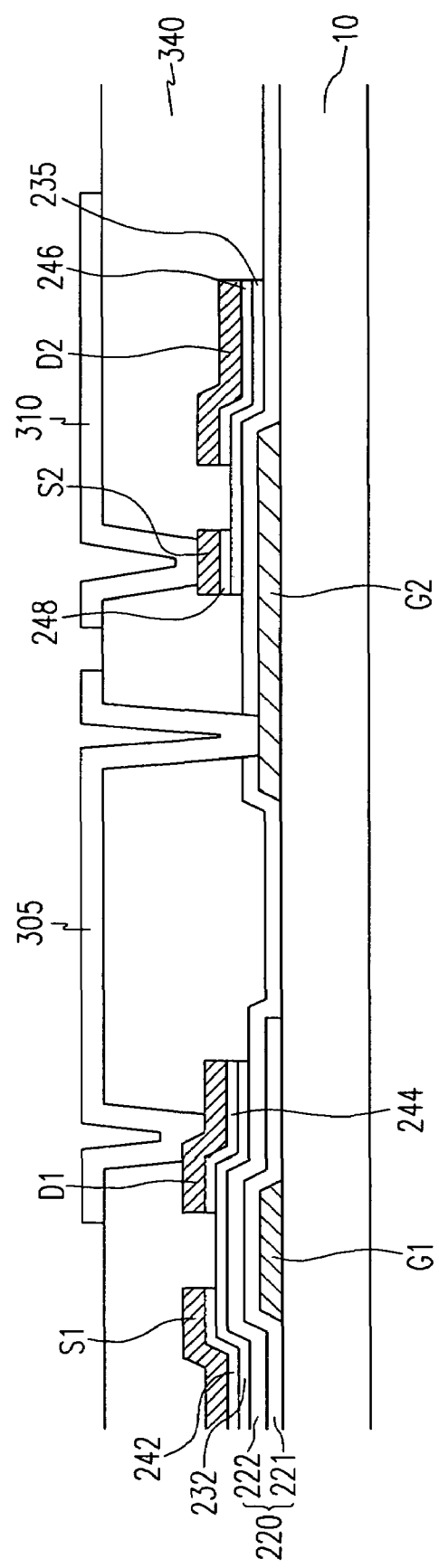
FIG. 14 is a cross-sectional view taken along the line E-E' of FIG. 13.

FIG. 13 is a plan view showing connecting electrode 305 and pixel electrode 310 formed on the structure of FIG. 11. FIG. 14 is a cross sectional view taken along the line E-E' of FIG. 13.

Referring to FIG. 13 and FIG. 14, a transparent conductive layer, which is often formed of indium tin oxide (ITO) or indium zinc oxide (IZO), is formed over insulating interlayer 340 and in contact holes CT1, CT2 and CT3. Then the conductive layer is patterned to form connecting electrode 305 and pixel electrode 310. Pixel electrode 310 electrically connects to second source electrode S2 through third contact hole CT3. Connecting electrode 305 electrically connects to first drain electrode through first contact hole CT1 and to second gate electrode G2 through second contact hole CT2.

Finally, as shown in FIGS. 2 and 3, an inorganic insulating layer or an organic insulating layer is deposited over first insulating interlayer 340, connecting electrode 305 and pixel electrode 310 and then patterned to form bank 350 and to expose pixel electrode 310.

Although not shown in FIGS. 3 and 4, in order to protect organic light emitting layer 320, a sealing cap or a thin protection film may be further formed over counter electrode 330. The protection film can be an organic material or inorganic material.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A display device comprising:
  a first transistor comprising a first gate electrode and a first gate insulating layer, wherein the first gate insulating layer comprises a first insulating layer and a second gate insulating layer, wherein the first insulating layer is disposed on the first gate electrode, and wherein the second gate insulating layer is disposed directly on the first insulating layer;
  a second transistor comprising a second gate electrode and the second gate insulating layer, the second gate insulating layer disposed on the second gate electrode; and
  a light emitting diode which is driven by the second transistor, wherein the first transistor connects to the second transistor through a connecting electrode such that the first transistor controls the second transistor.

2. The display device of claim 1, wherein a first drain electrode of the first transistor connects to the second gate insulating layer and a first drain electrode of the first transistor connects to a gate electrode of the second transistor.

3. The display device of claim 1, wherein the first gate insulating layer has a thickness of 3000 Å to 4500 Å.

4. The display device of claim 1, wherein the second gate insulating layer has a thickness of 1500 Å to 3000 Å.

5. The display device of claim 1, wherein the light emitting diode comprises a cathode, an anode, and a light-emitting element.

6. The display device of claim 5, wherein the light emitting element comprises an organic material.

7. A display device comprising:
  a first transistor that receives a data signal and outputs a control signal depending on the magnitude of the data signal, wherein the first transistor comprises a first gate electrode and a first gate insulating layer, wherein the first gate insulating layer comprises a first insulating layer and a second gate insulating layer, the first insulating layer is disposed on the first gate electrode, and wherein the second gate insulating layer is disposed directly on the first insulating layer;
  a second transistor connected to the first transistor through a connecting electrode and that receives the control signal from the first transistor and, in response to the control signal, produces a driving current, wherein the second transistor comprises the second gate electrode and a second gate insulating layer, the second gate insulating layer disposed on the second gate electrode; and
  a light emitting diode that receives the driving current and emits a light.

8. The display device of claim 7, further comprising a storage capacitor that stores the control signal from the first transistor in order for the second transistor to be maintained at a level of the control signal.

9. The display device of claim 1, wherein the thickness of the first gate insulating layer is 3000 Å to 4500 Å.

10. The display device of claim 1, wherein the thickness of the second gate insulating layer is 1500 Å to 3000 Å.

11. A method of manufacturing a display device, comprising:
  forming a first gate electrode and a second gate electrode over a substrate;
  forming a first insulating layer over the first and the second gate electrode;
  removing partially the first insulating layer in an area on and around the second gate electrode;
  forming a second insulating layer over the first insulating layer and the second gate electrode;
  forming a first semiconductor pattern over the second insulating layer on the first gate electrode and a second semiconductor pattern over the second insulating layer on the second gate electrode;
  forming a first source electrode and a first drain electrode on the first semiconductor pattern;
  forming a second source electrode and a second drain electrode on the second semiconductor pattern; and
  forming an organic light emitting diode connected to the second drain electrode.

12. The method of claim 11, further comprising:
  forming a doped amorphous silicon layer over the first semiconductor pattern; and
  forming a first ohmic contact layer and a second ohmic contact layer by patterning the doped amorphous silicon layer.

13. The method of claim 11, further comprising:
  forming a doped amorphous silicon layer over the second semiconductor pattern; and
  forming a third ohmic contact layer and a fourth ohmic contact layer by patterning the doped amorphous silicon layer.

14. The method of claim 11, wherein a storage capacitor is formed simultaneously in forming the second gate electrode.

15. The method of claim 11, further comprising:
  forming a first insulating interlayer, wherein the first insulating interlayer has a first contact hole, a second contact hole and a third contact hole, which exposes the first drain electrode, the second gate electrode and the second source electrode, respectively.

16. The method of claim 11, said forming the organic light emitting diode comprising:
  forming a connecting electrode connecting the first drain electrode to the second gate electrode and a pixel electrode connected to the second source electrode;
  forming an organic light emitting layer over the pixel electrode; and
  forming a counter electrode over the organic light emitting layer.

17. The method of claim 16, further comprising:
  forming a bank that exposes the pixel electrode.

18. The method of claim 16, wherein the counter electrode is transparent.

19. The method of claim 18, wherein the pixel electrode has a double-layer structure.

20. The method of claim 19, wherein the upper layer of the double-layer is formed of ITO or IZO and the lower layer of the double-layer is formed of a reflective layer.

21. The display device of claim 1, wherein the second gate insulating layer is thinner than the first gate insulating layer.

22. The display device of claim 1, wherein the second gate electrode does not overlap the first insulating layer.

23. The display device of claim 7, wherein the second gate electrode does not overlap the first insulating layer.

* * * * *